(12) United States Patent
Collins et al.

(10) Patent No.: US 6,440,813 B2
(45) Date of Patent: Aug. 27, 2002

(54) PROCESS OF MANUFACTURING A DRAM CELL CAPACITOR HAVING INCREASED TRENCH CAPACITANCE

(75) Inventors: Christopher N. Collins, Poughkeepsie; Harris C. Jones, Stormville; James P. Norum, Mount Kisco; Stefan Schmitz, Pleasant Valley, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/767,634

(22) Filed: Jan. 23, 2001

Related U.S. Application Data

(62) Division of application No. 09/328,961, filed on Jun. 9, 1999, now Pat. No. 6,188,096.

(51) Int. Cl.$^7$ ................................................. H01L 21/20
(52) U.S. Cl. ....................... 438/386; 438/243; 438/424; 438/700
(58) Field of Search .................................. 438/243–249, 438/386–392, 424, 421, 700, 702

(56) References Cited

U.S. PATENT DOCUMENTS

| | | | |
|---|---|---|---|
| 4,688,063 A | | 8/1987 | Lu et al. |
| 4,939,104 A | * | 7/1990 | Pollack et al. |
| 5,190,889 A | * | 3/1993 | Poon et al. |
| 5,525,544 A | * | 6/1996 | Kariyazono |
| 5,656,532 A | * | 8/1997 | Iseng |
| 5,731,941 A | * | 3/1998 | Hargrove et al. |
| 5,913,118 A | | 6/1999 | Wu |
| 6,015,985 A | | 1/2000 | Ho et al. |
| 6,297,088 B1 | * | 10/2001 | King |

* cited by examiner

Primary Examiner—George Fourson
Assistant Examiner—Thanh Pham
(74) Attorney, Agent, or Firm—Ratner & Prestia; Tiffany L. Townsend, Esq.

(57) ABSTRACT

A trench capacitor having an increased surface area. In one embodiment, the trench capacitor is a dual trench capacitor having a first trench and a second trench wherein inner walls of the trenches electrically connect. The invention also includes a single trench capacitor wherein the trench is curved around an axis substantially perpendicular to a substrate surface.

6 Claims, 6 Drawing Sheets

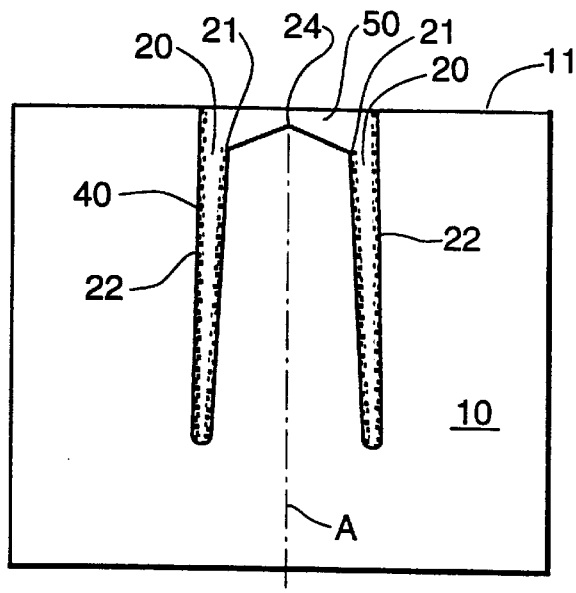
Fig. 1A
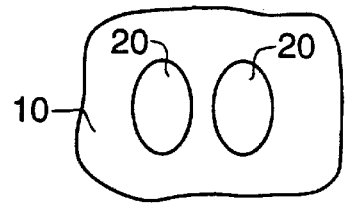
Fig. 1B
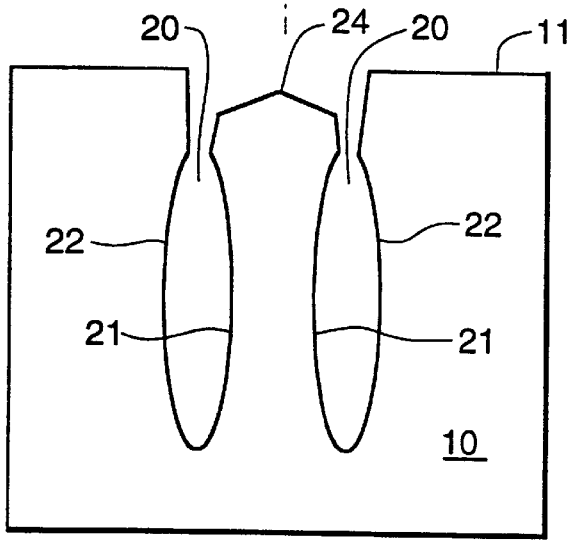
Fig. 2
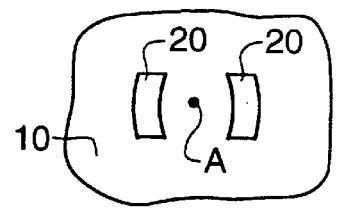
Fig. 1C
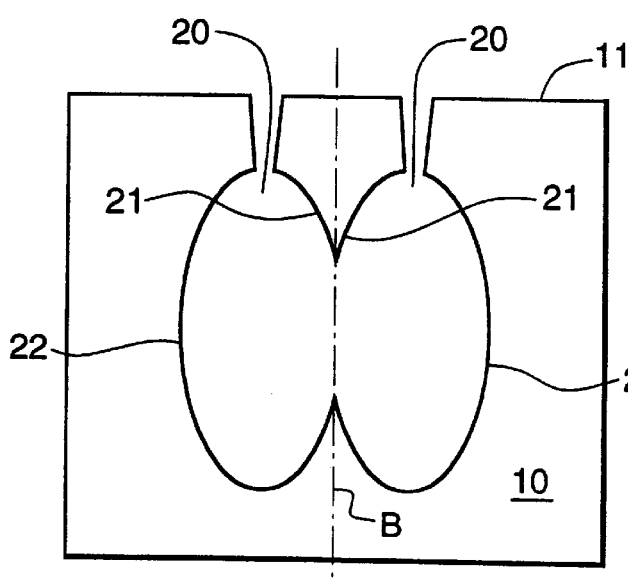
Fig. 3A
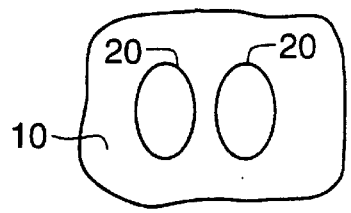
Fig. 3B
Fig. 3C

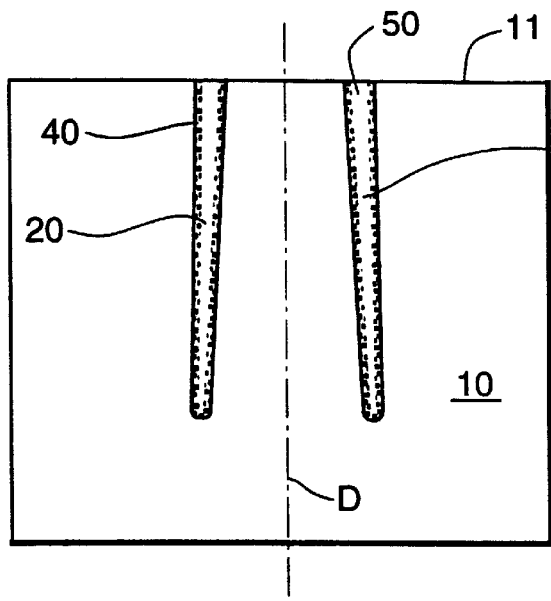
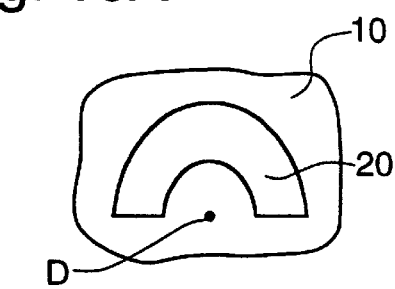
Fig. 10A
Fig. 10B
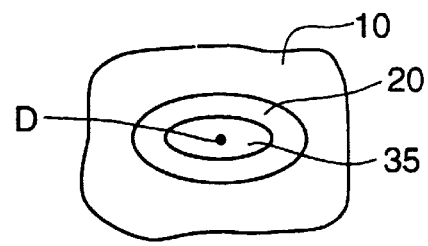
Fig. 10C
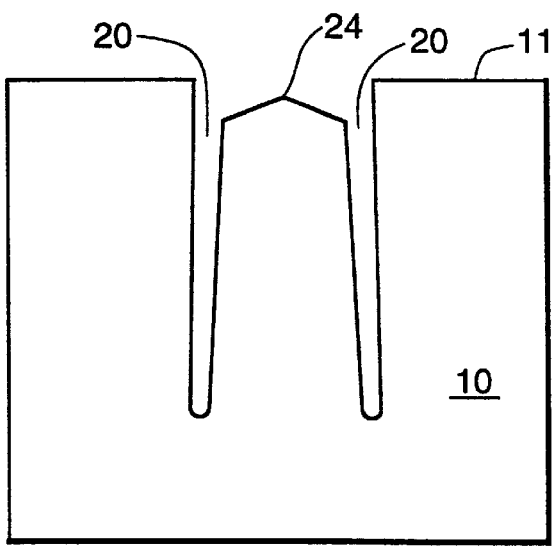
Fig. 11
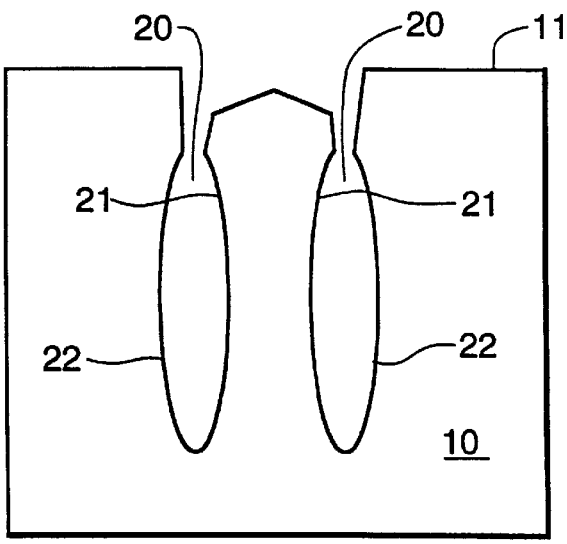
Fig. 12

PROCESS OF MANUFACTURING A DRAM CELL CAPACITOR HAVING INCREASED TRENCH CAPACITANCE

This application is a divisional of U.S. patent application Ser. No. 09/328,961, filed on Jun. 9, 1999 now U.S. Pat. No. 6,188,096, which has been allowed.

TECHNICAL FIELD

The present invention relates generally to a capacitor of a DRAM device and, more specifically, to a capacitor of a DRAM device having an increased surface area and to a process of manufacture.

BACKGROUND OF THE INVENTION

Typical Dynamic Random Access Memory (DRAM) cells have a transfer device, such as a field effect transistor (FET), having a capacitor for storing charge. Conventional capacitors include the stacked capacitor and the trench capacitor. In the trench capacitor, charge is stored vertically in a trench extending from a substrate.

The DRAM cell is so named because it can retain information only temporarily, on the order of milliseconds, even with power continuously applied. Therefore, the cell must be read and refreshed at periodic intervals. Although the storage time may at first appear very short, it is actually long enough to permit many memory operations between refresh cycles. The advantages of cost per bit, device density, and flexibility of use (i.e., both read and write operations are possible) have made DRAM cells the most widely used form of semiconductor memory to date.

Generally, the integrated circuit technology of a DRAM cell is based on the ability to form numerous transfer devices in a substrate. Recently, new techniques have enabled the reduction of DRAM cell dimensions, such as by shortening the length of the channel of the FET. As a result, the number of integrated circuits fabricated on a wafer has dramatically increased.

Unfortunately, DRAM device shrinkage has also reduced the size of the trench capacitors of DRAM cells. The reduction of trench capacitor surface area is the result of numerous factors. One cause of the surface area decrease is the reduction in trench mask opening size. A second cause of surface area decrease in the trench capacitor is the reduced trench depth that can be attained with the smaller trench mask opening size. As trench capacitor surface areas shrink, the capacitance of the trench capacitor also decreases. In addition, trench capacitor leakage does not decrease proportionally with capacitor size.

The decrease in the capacitance of conventional capacitors of DRAM cells show that a need exists for increasing the capacitance of the trench capacitor. To overcome the shortcomings of conventional DRAM cell capacitors, a new capacitor for a DRAM device and a process for fabricating such a capacitor are provided. An object of the present invention is to provide a capacitor of a DRAM device having an increased capacitance. A related object is top provide a DRAM capacitor having an increased capacitor retention time. Still another object of the present invention is to provide a process suitable for manufacturing a capacitor of a DRAM device having an increased capacitance and, therefore, an increased capacitor retention time.

SUMMARY OF THE INVENTION

To achieve these and other objects, and in view of its purposes, the present invention provides a capacitor of a DRAM device having an increased capacitance. Also provided is a process of fabricating the capacitor. More specifically, the present invention provides a dual trench capacitor comprising a first trench adjacent a second trench in a substrate. The trenches have a top on the surface of the substrate, a bottom in the substrate, and opposing inner and outer side walls extending from the top to the bottom. The inner side wall of the first trench electrically contacts the inner side wall of the second trench.

The dual trench capacitor of the invention is fabricated by forming a mask on a substrate, the mask having a mask island formed between openings in the mask which extend to the surface of the substrate. The substrate is etched through the openings to form the trenches. In one embodiment, the mask island and a portion of the substrate surface underlying the mask island are removed such that the first trench electrically contacts the second trench. In another embodiment, the trench side walls are radially expanded below a surface of the substrate such that the trench inner walls electrically contact.

The present invention also provides a trench capacitor having a single trench, in which the trench is curved around an axis substantially perpendicular to the substrate surface. The single trench capacitor of the present invention is fabricated by forming a mask on a substrate, the mask having a mask island and an opening curved around an axis substantially perpendicular to a surface of the substrate. The exposed substrate surface is etched to form the trench.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 1A shows in schematic representation a first embodiment of a dual trench capacitor formed in accordance with the present invention;

FIG. 1B shows in schematic representation a top view of the dual trench capacitor shown in FIG. 1A;

FIG. 1C shows in schematic representation a top view of the dual trench capacitor shown in FIG. 1A, in which trenches curve around an axis substantially perpendicular to a substrate surface;

FIG. 2 shows in schematic representation a second embodiment of a dual trench capacitor formed in accordance with the present invention;

FIG. 3A shows in schematic representation a third embodiment of a dual trench capacitor formed in accordance with the present invention;

FIG. 3B shows in schematic representation a top view of the dual trench capacitor shown in FIG. 3A;

FIG. 3C shows in schematic representation a top view of the dual trench capacitor shown in FIG. 3A, in which the trenches curve around an axis substantially perpendicular to a substrate surface;

FIG. 10A shows in schematic representation a single trench capacitor formed in accordance with the present invention;

FIG. 10B shows in schematic representation a top view of the trench capacitor shown in FIG. 10A;

FIG. 10C shows in schematic representation a top view of the trench capacitor shown in FIG. 10A, in which a trench curves completely around an axis substantially perpendicular to a substrate surface;

FIG. 11 shows in schematic representation a single trench capacitor formed in accordance with the present invention;

FIG. 12 shows in schematic representation another single trench capacitor formed in accordance with the present invention;

DETAILED DESCRIPTION OF THE INVENTION

Figure 4A:
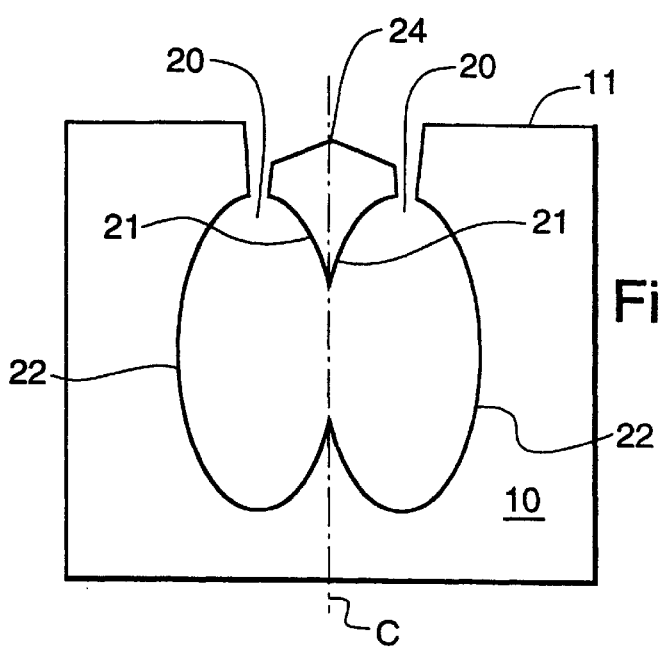
FIG. 4A shows in schematic representation a fourth embodiment of a dual trench capacitor formed in accordance with the present invention.

The present invention will next be described with reference to the figures in which similar numbers indicate the same elements in all figures. Such figures are intended to be illustrative, rather than limiting, and are included to facilitate the explanation of the apparatus and process of the present invention. It has been discovered that, by increasing the surface area of the trench of a trench capacitor, the capacitance of the trench increases. The present invention relates both to dual trench and single trench capacitors and to a process of fabricating such capacitors.

A. Dual Trench Capacitor

FIGS. 1A through 4C illustrate dual trench capacitors formed in accordance with the principles of the present invention. It has been discovered that when two adjacent trenches are electrically contacted to form a single capacitor, the capacitance of the capacitor increases due to an increase in the surface area of the capacitor.

FIG. 1A illustrates a first embodiment of the present invention. As shown in this figure, a substrate 10 is provided. Two trenches 20 are formed in substrate 10. Trenches 20 extend into substrate 10 from a surface 11 of substrate 10.

The trench capacitor illustrated in FIG. 1A is a dual trench capacitor. The inner side walls 21 of trenches 20 are electrically connected through a contact bridge 24 adjacent to surface 11 of substrate 10. By connecting two adjacent trenches 20 just below surface 11 of substrate 10 by forming contact bridge 24, a trench capacitor having an increased capacitance is formed.

Substrate 10 of the present invention can be any material commonly used as substrates for trench capacitors, such as silicon. During further processing of the dual trench capacitors of the present invention, such as the capacitor illustrated in FIG. 1A, a dielectric layer 40 is formed on trench inner side walls 21 and trench outer side walls 22. Dielectric layer 40 can be selected from those conventionally used, such as silicon oxide, silicon nitride, or combinations of those materials. In addition, a first electrode 50, such as highly doped polysilicon, is deposited in trenches 20 to complete the capacitor. Substrate 10 constitutes a second electrode.

FIG. 1B illustrates a top view of the trench capacitor illustrated in FIG. 1A. As shown in FIG. 1B, trenches 20 have an elliptical top view shape. FIG. 1C illustrates another top view of the trench capacitor illustrated in FIG. 1A. In this embodiment, trenches 20 are curved around an axis, A, substantially perpendicular to surface 11 of substrate 10. By forming trenches 20 having this configuration, the surface area of trenches 20 is further increased, resulting in an additional increase in the capacitance of the trench capacitor. Therefore, in a preferred embodiment of the present invention, trenches 20 are curved around an axis substantially perpendicular to the surface 11 of substrate 10, as illustrated in FIG. 1C.

Figure 5:
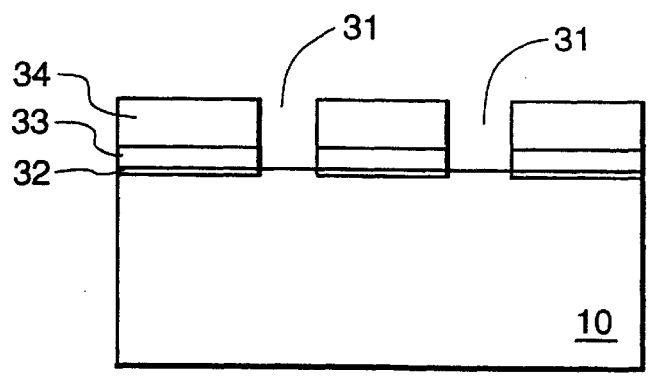
FIG. 5 shows in schematic representation a substrate having a mask applied to the substrate.

In accordance with the principles of the present invention, the trench capacitor illustrated in FIG. 1A is formed by the following steps. A mask 30 is formed on substrate 10. Mask 30 has openings 31 corresponding to regions in where trenches 20 will be formed. This structure is illustrated in FIG. 5. Mask 30 can be any of those masks conventionally used to form trenches. Mask 30 illustrated in FIG. 5 consists of a first silicon oxide layer 32, a nitride layer 33, and a second silicon oxide layer 34. Substrate 10 can be any of those materials conventionally used as substrates in DRAM cells, such as silicon.

Figure 6:
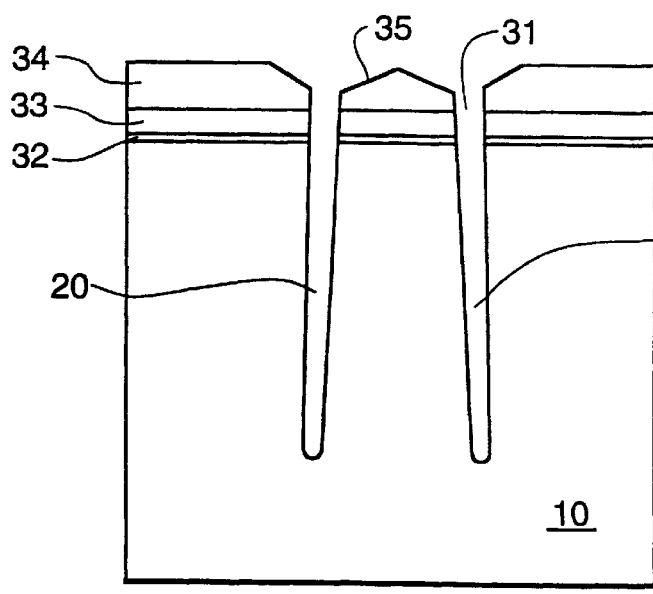
FIG. 6 shows in schematic representation the substrate shown in FIG. 5 having two trenches formed in the substrate.

Following formation of mask 30 on substrate 10, trenches 20 are etched into substrate 10. Trenches 20 extend from surface 11 of substrate 10. This structure is illustrated in FIG. 6. Trenches 20 can be formed in substrate 10 using techniques commonly used to form trenches, such as reactive ion etching (RIE).

Figure 7:
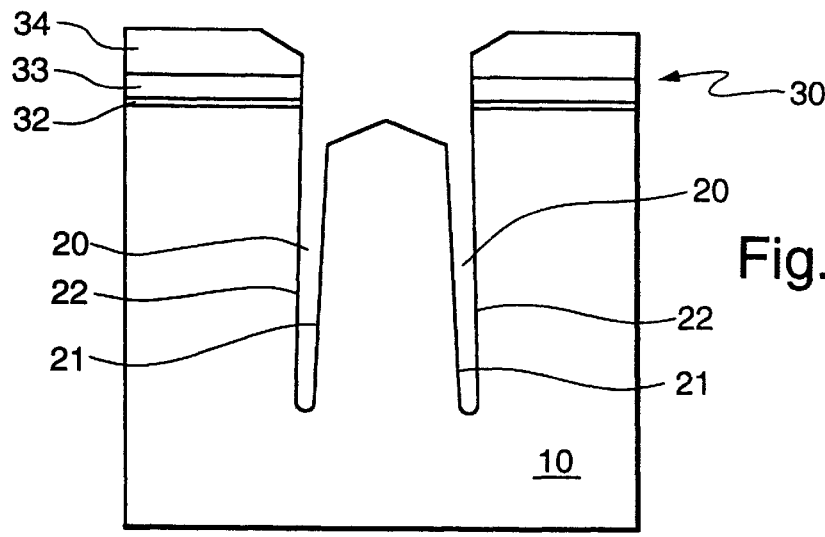
FIG. 7 shows in schematic representation a substrate having alternative dual trenches and a mask formed on the substrate.

When etching trenches 20, the portion of mask 30 between trenches 20—referred to as the mask island 35—is often partially eroded, as shown in FIG. 6. It has been discovered that mask island 35 can be completely eroded such that trenches 20 electrically contact through contact bridge 24 adjacent to surface 11 of substrate 10, as illustrated in FIG. 1A. After further processing of trenches 20, the resulting contact bridge 24 is composed of a first electrode material. FIG. 7 illustrates the structure of FIG. 6 after mask island 35 has been eroded FIG. 2 illustrates a second embodiment of a dual trench capacitor formed in accordance with the present invention.

In comparison to the capacitor of FIG. 1A, the trench inner side walls 21 and outer side walls 22 have been radially expanded in the capacitor of FIG. 2. The opposing side walls 21, 22 of trenches 20 have been formed such that they curve away from each other from the top of trenches 20 to the bottom. As illustrated, trenches 20 have an elliptical cross section. Although both trenches 20 have been radially expanded in FIG. 2, it may be desirable to radially expand only one of the two trenches.

Figure 8:
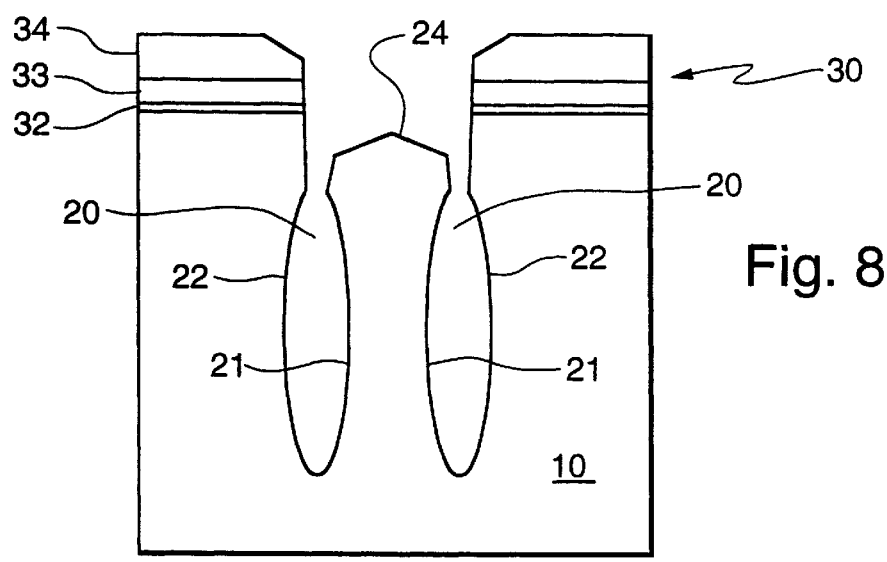
FIG. 8 shows in schematic representation a substrate having alternative dual trenches and a mask formed on the substrate.

Radially expanded inner and outer side walls 21, 22, as illustrated in FIG. 2, can be formed using several techniques. When reactive ion etching substrate 10 through mask 30 to form trenches 20, side walls 21, 22 can be radially expanded by increasing the cathode temperature of the etching chamber. Side walls 21, 22 can also be radially expanded by etching trench side walls 21, 22 with a plasma comprising $NF_3$, HBr, and $HeO_2$. Similarly, side walls 21, 22 can be radially expanded by etching side walls 21, 22 with a gas selected from $SF_6$, $CF_4$, $Cl_2$, or combinations of such components. FIG. 8 illustrates a structure in which side walls 21, 22 have been radially expanded by one of these processes.

FIG. 3A illustrates a third embodiment of the present invention. As illustrated, two trenches 20 extend from surface 11 of substrate 10. The dual trench capacitor illustrated in FIG. 3A has trench inner side walls 21 that physically contact below surface 11 of substrate 10. By connecting two adjacent trenches 20, a dual trench capacitor having an increased capacitance is formed.

Figure 9:
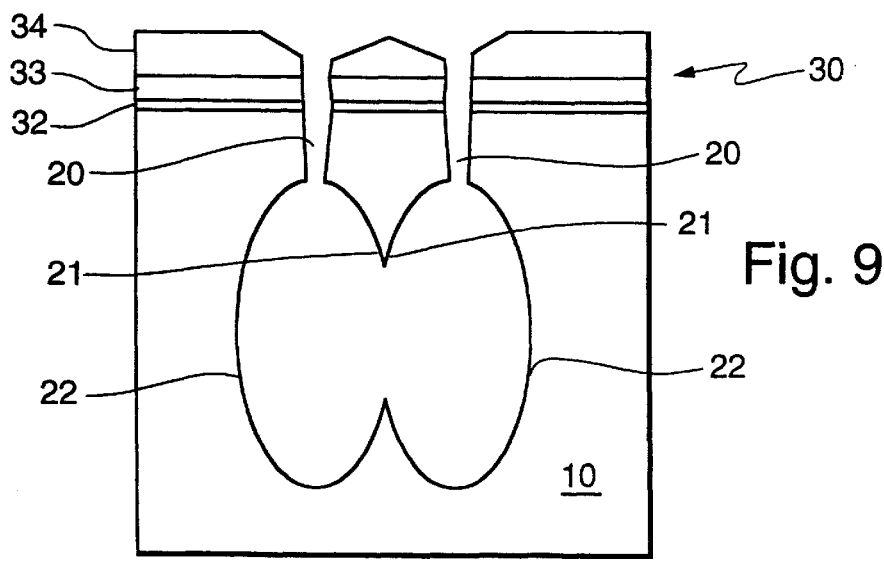
FIG. 9 shows in schematic representation a substrate having still alternative dual trenches and a mask formed on the substrate.

Inner and outer side walls 21, 22 illustrated in FIG. 3A can be radially expanded by increasing the cathode temperature of the etching chamber while reactive ion etching trenches 20. Side walls 21, 22 can also be radially expanded by etching trench side walls 21, 22 with a plasma comprising $NF_3$, HBr, and $HeO_2$. Similarly, side walls 21, 22 can be radially expanded using a gas selected from $SF_6$, $CF_4$, $Cl_2$, or combinations of such components. FIG. 9 illustrates a structure in which side walls 21, 22 have been radially expanded and physically contacted so that adjacent trenches 20 connect near their midpoints.

FIG. 3B illustrates a top view of the trench capacitor illustrated in FIG. 3A. As shown in FIG. 3B, trenches 20 have an elliptical top view shape. FIG. 3C illustrates another top view of the trench capacitor illustrated in FIG. 3A. In this embodiment, trenches 20 are curved around an axis, B, substantially perpendicular to surface 11 of substrate 10. By forming trenches 20 having this configuration, the surface area of trenches 20 is further increased, resulting in an additional increase in the capacitance of the trench capacitor. Therefore, in a preferred embodiment of the present invention, trenches 20 are curved around an axis substantially perpendicular to the surface 11 of substrate 10, as illustrated in FIG. 3C.

FIG. 4A illustrates a fourth embodiment of the present invention. As illustrated, two trenches 20 extend from surface 11 of substrate 10. The dual trench capacitor illustrated in FIG. 4A has the combined features of the embodiments of FIGS. 1A and 3A. Specifically, the inner side walls 21 of trenches 20 are electrically connected through contact bridge 24 adjacent to surface 11 of substrate 10 and inner side walls 21 physically contact below surface 11 of substrate 10. By connecting two adjacent trenches 20, the dual trench capacitor has an increased capacitance.

Figure 4B:
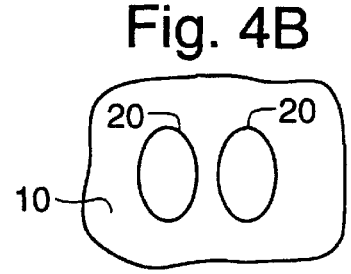
FIG. 4B shows in schematic representation a top view of the dual trench capacitor shown in FIG. 4A.
Figure 4C:
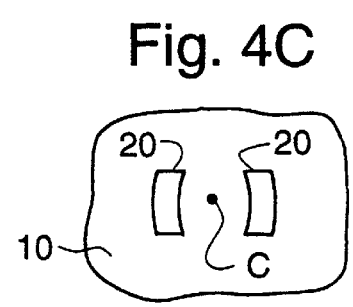
FIG. 4C shows in schematic representation a top view of the dual trench capacitor shown in FIG. 4A, in which the trenches curve around an axis substantially perpendicular to the substrate surface.

FIG. 4B illustrates a top view of the trench capacitor illustrated in FIG. 4A. As shown in FIG. 4B, trenches 20 have an elliptical top view shape. FIG. 4C illustrates another top view of the trench capacitor illustrated in FIG. 4A. In this embodiment, trenches 20 are curved around an axis, C, substantially perpendicular to surface 11 of substrate 10. By forming trenches 20 having this configuration, the surface area of trenches 20 is further increased, resulting in an additional increase in the capacitance of the trench capacitor. Therefore, in a preferred embodiment of the present invention, trenches 20 are curved around an axis substantially perpendicular to the surface 11 of substrate 10, as illustrated in FIG. 4C.

B. Single Trench Capacitor

FIGS. 10A through 14 illustrate single trench capacitors formed in accordance with principles of the present invention. As shown in these figures, the trenches of the present invention have an increased surface area as compared to conventional trench capacitors. By increasing the surface area of the trench, the capacitance of the trench capacitor is likewise increased.

FIG. 10A illustrates another embodiment of the present invention. As shown in this figure, a substrate 10 has a trench 20 formed extending from a surface 11 of substrate 10. The trench capacitor illustrated in FIG. 10A is a single trench capacitor. The single trench capacitor of the present invention is formed such that it is curved partially around an axis, D, substantially perpendicular to surface 11 of substrate 10. This structure is illustrated, as a top view, in FIG. 10B.

The single trench capacitor can also be formed such that trench 20 completely surrounds a mask island 35. Trench 20 completely surrounds and is symmetrical about axis D which is substantially perpendicular to surface 11 of substrate 10. Thus, trench 20 forms a donut shape as it surrounds mask island 35. Such a structure is illustrated in FIG. 10C.

By forming trench 20 having these configurations, the surface area of trench 20 is further increased. Such increased surface area results in an additional increase in the capacitance of the trench capacitor. Therefore, in a preferred embodiment of the present invention, trench 20 is curved around an axis substantially perpendicular to the surface 11 of substrate 10, as illustrated in FIGS. 10B and 10C.

Substrate 10 of the present invention can be any of those materials used as substrates for trench capacitors, such as silicon. During further processing of the single trench capacitors of the present invention, such as the capacitor illustrated in FIG. 10A, a dielectric layer 40 is formed on the trench side walls 21 and 22. Dielectric layer 40 can be selected from those conventionally used, such as silicon oxide, silicon nitride, or combinations of those materials. In addition, a first electrode 50, such as highly doped polysilicon, is deposited in trench 20 to complete the capacitor.

Figure 15:
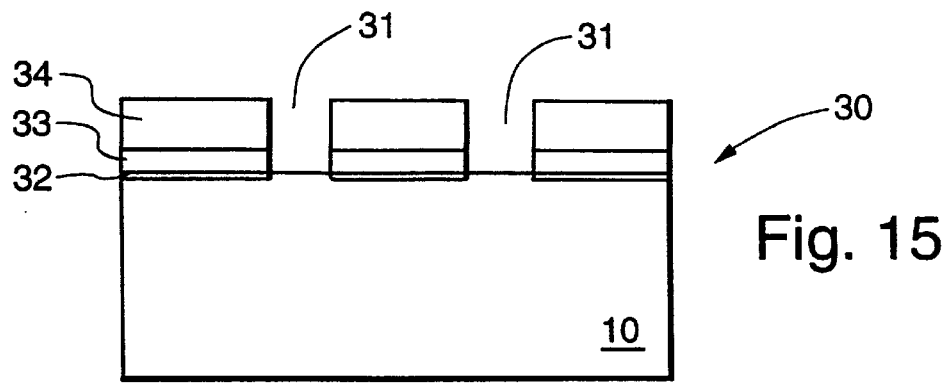
FIG. 15 shows in schematic representation a substrate having a mask applied to the substrate.

In accordance with the principles of the present invention, the trench capacitor illustrated in FIGS. 10A, 10B, and 10C can be formed by the following steps. A mask 30 is formed on substrate 10. Mask 30 has an opening 31 corresponding to regions in which trench 20 will be formed. This structure is illustrated in FIG. 15. Opening 31 is curved around an axis substantially perpendicular to the substrate surface, and exposes the substrate surface.

Next, the exposed substrate surface is etched, thereby forming trench 20. Mask 30 can be any of those masks conventionally used to form trenches. The mask illustrated in FIG. 15 comprises a first silicon oxide layer 32, a nitride layer 33, and a second silicon oxide layer 34. Substrate 10 can be any of those materials conventionally used as substrates in DRAM cells, such as silicon.

Figure 16:
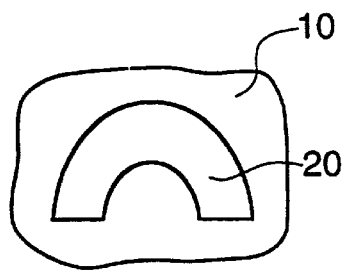
FIG. 16 shows in schematic representation a top view of the trench capacitor shown in FIG. 15.
Figure 17:
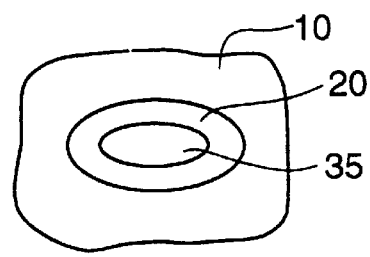
FIG. 17 shows in schematic representation a top view of the trench capacitor shown in FIG. 15, in which a trench curves completely around an axis substantially perpendicular to a substrate surface.

FIGS. 16 and 17 illustrate top views of the single trench capacitor formed in accordance with principles of the present invention. Trench 20 illustrated in FIG. 16 is curved partially around an axis substantially perpendicular to the substrate surface. Trench 20 illustrated in FIG. 17 is curved completely around an axis substantially perpendicular to the substrate surface such that it completely surrounds mask island 35.

Figure 18:
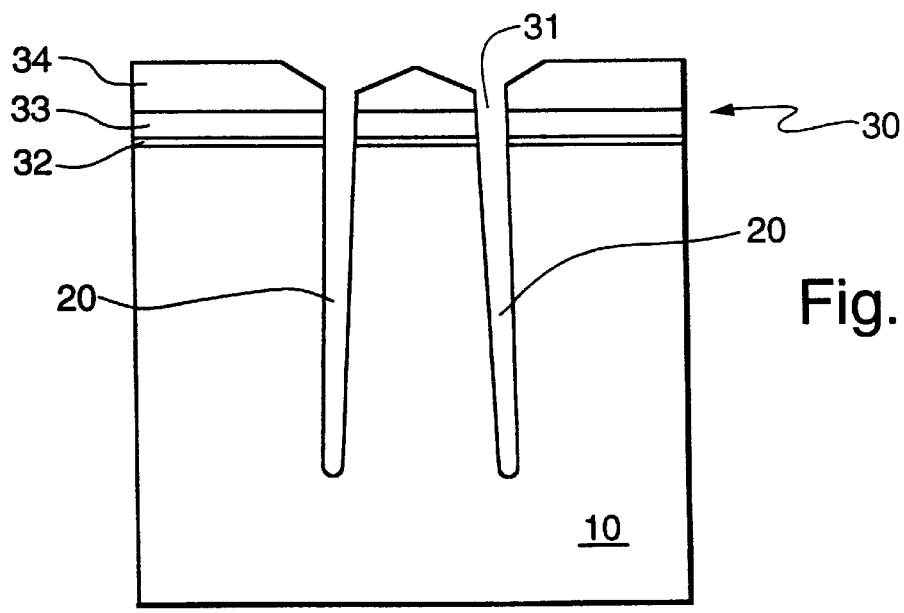
FIG. 18 shows in schematic representation the substrate shown in FIG. 15 having a trench formed in the substrate.

Following formation of mask 30 on substrate 10, trench 20 is etched into substrate 10 extending from surface 11 of substrate 10. This structure is illustrated in FIG. 18. Trench 20 can be formed in substrate 10 using techniques conventionally used to form trenches, such as reactive ion etching.

In forming trench 20, mask island 35 between inner side walls 21 of trench 20 is often partially eroded. It has been discovered that mask island 35 can be completely eroded such that contact bridge 24 is formed adjacent to surface 11 of substrate 10, as illustrated in FIG. 11.

FIG. 12 illustrates another embodiment of the present invention. As shown in this figure, trench inner side walls 21 and outer side walls 22 have been radially expanded. The opposing side walls 21, 22 of trench 20 have been formed such that they curve away from each other from the top of trench 20 to the bottom. As shown in FIG. 12, opposing side walls 21, 22 curve in opposite directions and reach a maximum distance from each other at a point intermediate the top and bottom of trench 20.

The radially expanded side walls 21 and 22, as illustrated in FIG. 12, can be formed using several techniques. When reactive ion etching substrate 10 through mask 30 to form trench 20, side walls 21, 22 can be radially expanded by increasing the cathode temperature of the etching chamber. Side walls 21, 22 can also be radially expanded by etching trench side walls 21, 22 with a plasma comprising $NF_3$, HBr, and $HeO_2$. Similarly, side walls 21, 22 can be radially expanded by etching side walls 21, 22 with a gas selected from $SF_6$, $CF_4$, $Cl_2$, or combinations of those components.

Figure 13:
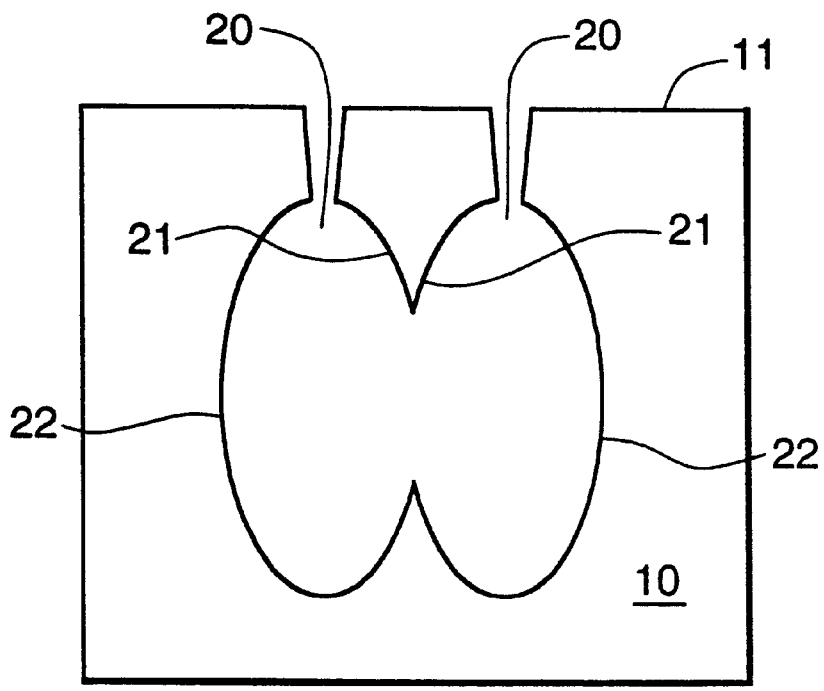
FIG. 13 shows in schematic representation still another single trench capacitor formed in accordance with the present invention.

FIG. 13 illustrates another embodiment of the present invention. As shown in this figure, trench inner side walls 21 and outer side walls 22 have been radially expanded such that inner side walls 21 of trench 20 physically contact below surface 11 of substrate 10. The single trench illustrated in FIG. 13 is formed such that it curves partially around an axis substantially perpendicular to the substrate surface, as illustrated in FIG. 10B.

Figure 14:
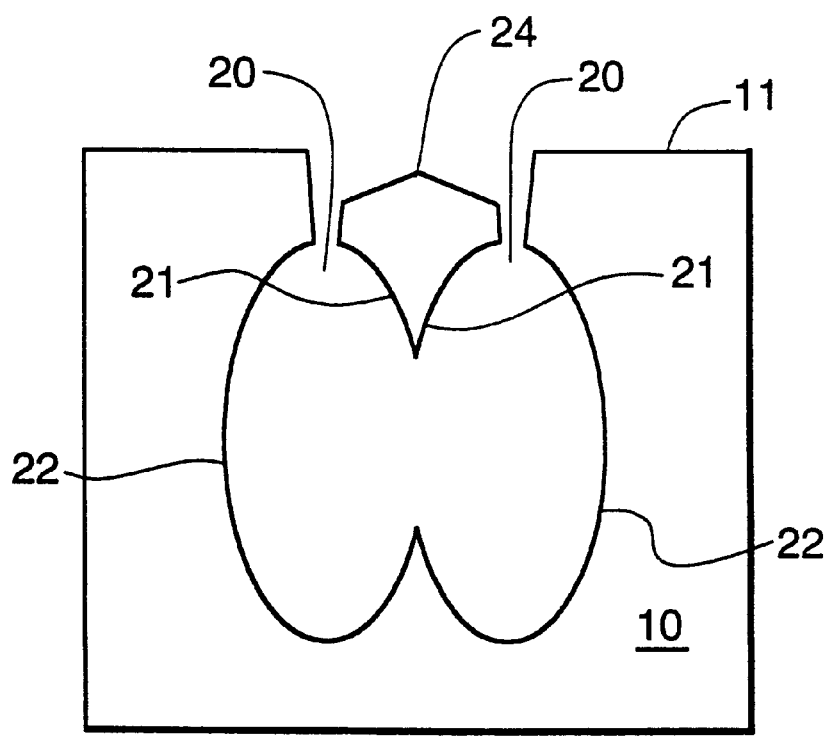
FIG. 14 shows in schematic representation yet a further single trench capacitor formed in accordance with the present invention.

The trench capacitor illustrated in FIG. 14 is a single trench capacitor having the combined features of FIGS. 11 and 13. Specifically, inner side walls 21 of trench 20 are electrically connected through contact bridge 24 adjacent to surface 11 of substrate 10. Inner side walls 21 physically contact below surface 11 of substrate 10. The single trench illustrated in FIG. 14 is formed such that it curves partially around an axis substantially perpendicular to the substrate surface, as illustrated in FIG. 10B.

Although illustrated and described above with reference to specific embodiments, the present invention is nevertheless not intended to be limited to the details shown. Rather, various modifications may be made in the details within the scope and range of equivalents of the claims and without departing from the spirit of the invention.

What is claimed:

1. A process of fabricating a trench capacitor having a trench extending in a substrate, said trench having side walls, wherein the trench is curved around an axis substantially perpendicular to a substrate surface, said process comprising the steps of:

forming a mask on a substrate, said mask having an opening curved around an axis substantially perpendicular to a substrate surface, said opening extending to the substrate, and said mask having a mask isolation portion defined by said curved opening in said mask;

etching said substrate through said opening to form said trench, and etching the mask isolation portion and the surface of said substrate underlying said mask isolation portion.

2. The process of claim 1 wherein said curved trench completely surrounds said axis.

3. The process of claim 1 wherein said side walls are radially expanded.

4. The process of claim 3 wherein radially expanded side walls are formed by reactive ion etching the substrate in an etching chamber having a cathode, and increasing the temperature of the cathode to radially expand said side walls.

5. The process of claim 3 wherein radially expanded side walls are formed by etching the substrate with a plasma comprising $NF_3$, HBr, and $HeO_2$.

6. The process of claim 3 wherein radially expanded side walls are formed by etching the side walls with a gas selected from the group consisting of $SF_6$, $CF_4$, $Cl_2$, and a combination thereof.

* * * * *